US009012263B1

(12) United States Patent
Mathew et al.

(10) Patent No.: US 9,012,263 B1
(45) Date of Patent: Apr. 21, 2015

(54) METHOD FOR TREATING A BOND PAD OF A PACKAGE SUBSTRATE

(71) Applicants: Varughese Mathew, Austin, TX (US); Burton J. Carpenter, Austin, TX (US); Leo M. Higgins, III, Austin, TX (US)

(72) Inventors: Varughese Mathew, Austin, TX (US); Burton J. Carpenter, Austin, TX (US); Leo M. Higgins, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/069,103

(22) Filed: Oct. 31, 2013

(51) Int. Cl.
*H01L 21/768* (2006.01)
*H01L 23/48* (2006.01)
*H01L 23/485* (2006.01)
*H01L 23/488* (2006.01)
*H01L 31/00* (2006.01)
*H01L 23/00* (2006.01)

(52) U.S. Cl.
CPC ............... *H01L 24/05* (2013.01); *H01L 24/85* (2013.01); *H01L 2224/04042* (2013.01); *H01L 2224/85011* (2013.01)

(58) Field of Classification Search
CPC ..... H01L 21/768; H01L 23/48; H01L 23/485; H01L 23/488; H01L 31/00
USPC .......................................... 438/106, 127, 617
See application file for complete search history.

(56) References Cited

U.S. PATENT DOCUMENTS

| 4,188,438 | A | 2/1980 | Burns | |
|---|---|---|---|---|
| 2002/0058417 | A1* | 5/2002 | Li et al. | 438/687 |
| 2004/0195696 | A1* | 10/2004 | Lee et al. | 257/762 |
| 2007/0290166 | A1* | 12/2007 | Liu et al. | 252/79.2 |
| 2009/0093110 | A1* | 4/2009 | Lee et al. | 438/613 |
| 2012/0270396 | A1* | 10/2012 | Hosomi | 438/687 |
| 2013/0045391 | A1 | 2/2013 | Feng | |
| 2013/0193576 | A1* | 8/2013 | Mathew | 257/751 |
| 2013/0338305 | A1* | 12/2013 | Duong et al. | 524/557 |

FOREIGN PATENT DOCUMENTS

JP          2874088 B2     3/1999

OTHER PUBLICATIONS

Evans, Comparison and Evolution of Copper CMP Consumable Technology, Mat. Res. Soc. Symp. Proc. vol. 732E © 2002 Materials Research Society.*
Abelev, E. et al., "Potassium sorbate—A new aqueous copper corrosion inhibitor Electrochemical and spectroscopic studies", Electrochimica Acta, 2007, pp. 1975-1982.
Copper Development Assocation, Inc., "Benzotriazole: An effective corrosion inhibitor for copper alloys", www.copper.org, pp. 1-10.
Copper Development Assocation, Inc., "Clear Organic Finishes for Copper and Copper Alloys", http://www.copper.org/resources/properties/protection/clear_finishes.html, Oct. 28, 2013, pp. 1-5.

(Continued)

*Primary Examiner* — Kimberly Rizkallah
*Assistant Examiner* — Brian Turner
(74) *Attorney, Agent, or Firm* — Joanna G. Chiu; James L. Clingan, Jr.

(57) ABSTRACT

A method of making a package substrate having a copper bond pad and a location for receiving a semiconductor die having a remnant of one of a group consisting of HEDP and an HEDP derivative on a top surface of the copper bond pad. The semiconductor die is attached to the substrate. A wirebond connection is attached between the remnant and the semiconductor die.

20 Claims, 4 Drawing Sheets

(56) References Cited

OTHER PUBLICATIONS

Ebadi, M. et al., "Corrosion inhibition properties of pyrazolylindolenine compounds on copper surface in acidic media", Chemistry Central Journal 2012, vol. 6, No. 163, 20 pages.

Huynh, N., "The Inhibition of Copper Corrosion in Aqueous Environments With Heterocyclic Compounds", Queensland University of Technology School of Physical Sciences, Doctor of Philosophy Thesis Examination, Feb. 2004, 99 pages.

Luo, Y., et al., "The Mechanism of Copper-Corrosion Inhibition by Thiadiazole Derivatives", Journal of the Society of Tribologists and Lubrication Engineers, Apr. 1995, vol. 51, No. 4, pp. 293-296.

Silverman, D.C., et al., "Potential-pH (Pourbaix) Diagrams as Aids for Screening Corrosion Inhibitors and Sequestering Agents", Corrosion Science Section, May 2010, vol. 66, No. 5, 12 pages.

U.S. Appl. No. 61/835,718, Carpenter, B. et al., "Tin-Based Wirebound Structures" filed Jun. 17, 2013.

Vastag, G., et al., "New inhibitors for copper corrosion", Pure and Applied Chemistry, 2001, vol. 73, No. 12., pp. 1861-1869.

Yim, M., et al., "Oxidation Prevention and Electrical Property Enhancements of Copper-filled Electrically Conductive Adhesives for Electronic Packaging and Interconnection", 2007 Electronic Components and Technology Conference, pp. 82-88.

Zheng, Y., "Study of Copper Applications and Effects of Copper Oxidation in Microelectronic Package", May 10, 2003, 26 pages.

\* cited by examiner

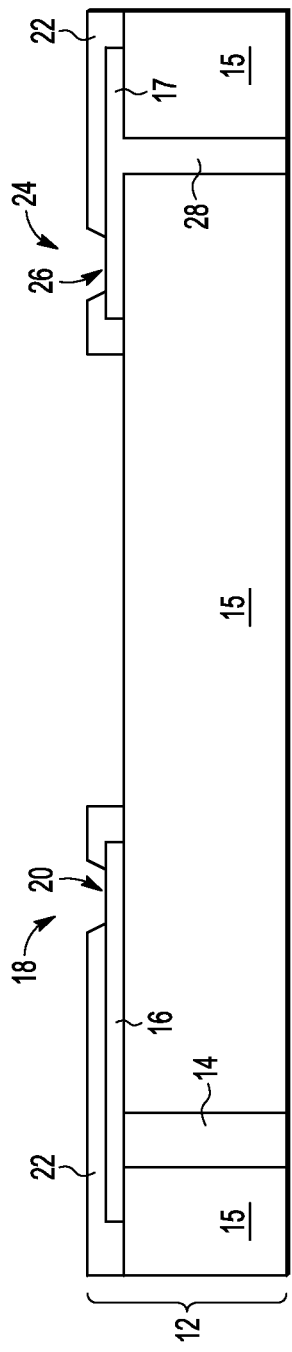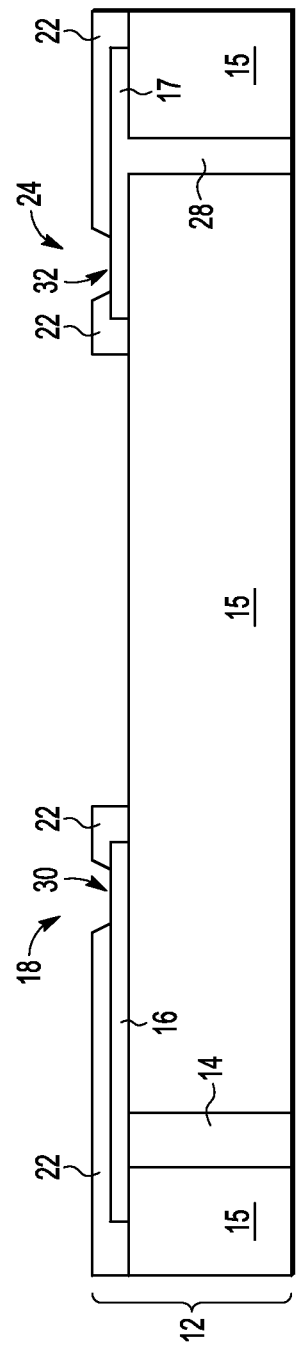

METHOD FOR TREATING A BOND PAD OF A PACKAGE SUBSTRATE

BACKGROUND

1. Field

This disclosure relates generally to semiconductors, and more specifically, to a method for treating a bond pad of a package substrate.

2. Related Art

Some microelectronic device packages include wire bonds for providing electrical coupling between a package substrate and an encapsulated die. Typically, a wire bond includes a piece of wire that couples a terminal on the die to a pad on the package substrate. Although the wire itself can be made of copper, the point of contact on the substrate's pad is not fabricated with bare copper since bare copper pads oxidize over time, making the resulting bonds unreliable.

To address some of these concerns, a substrate wire bonding structure may include a plating material that is deposited over a layer of copper to protect it from oxidation while enabling a metallurgical bond to be formed between the wire and the structure. Most widely used plating materials include gold. However, the use of gold on a package substrate presents a significant manufacturing cost. Also, OSPs (Organic Solderability Preservatives) have been tried as a coating to protect a copper pad from oxidizing, but this practice results in weak connections because the resulting OSP coating is too thick for reliable wire bonding because it leaves an organic residue between the wire and the pad.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 1-5 illustrate, in cross-sectional form, a semiconductor structure at various stages of processing in accordance with an embodiment of the present invention.

DETAILED DESCRIPTION

Figure 3:
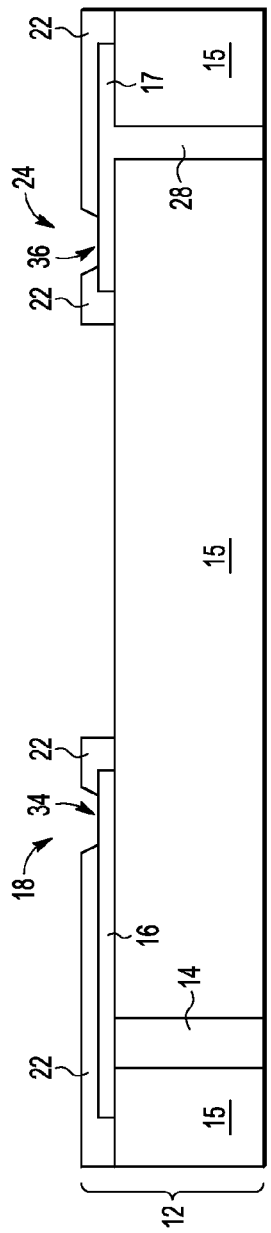

The formation of copper oxide on a copper bonding pad of a package substrate prevents the ability to reliably make a wire bond connection. Therefore, in one embodiment, the bonding pad is prepared by removing any native copper oxide formed on the surface of the copper bonding pad and subsequently treated with a solution to inhibit copper oxidation. In one embodiment, this solution includes 1-Hydroxyethylidene-1, 1-Diphosphonic Acid (HEDP) or an alkyl derivative of HEDP. After treatment of the bond pad with this solution to inhibit copper oxidation, a reliable wire bond connection can be made between the treated bonding pad of the package substrate and a semiconductor die attached to the package substrate.

FIGS. 1-5 illustrate, in cross-sectional form, a semiconductor structure 10 at various stages in processing in accordance with one embodiment of the present invention. FIG. 6 illustrates, in flow diagram form, a method 50 of processing semiconductor structure 10 in accordance with one embodiment, and FIGS. 1-5 will be described in reference to method 50 of FIG. 6.

FIG. 1 illustrates, in cross-sectional form, a semiconductor structure 10 at a stage in processing in accordance with one embodiment of the present invention. Semiconductor structure 10 includes a package substrate 12. Package substrate 12 includes a dielectric layer 15, a soldermask 22, conductive traces such as conductive traces 16 and 17, conductive interconnects such as conductive interconnects 14 and 28, and bond pads such as bond pads 18 and 24. The conductive traces and conductive interconnects route signals between the bond pads, such as bond pads 18 and 24, through package substrate 12 to a backside of substrate 12 to allow for external electrical connections, such as, for example, to a printed circuit board (PCB). Note that package substrate 12 may include any number of interconnect layers which may include interlayer and intralayer conductive interconnects, in which traces 16 and 17 and conductive interconnects 14 and 28 provide representative examples. In the illustrated embodiment, trace 16 is connected to bond pad 18 and interconnect 14, and trace 17 is connected to bond pad 24 and interconnect 28. Soldermask 22 includes openings to expose the bond pads, such as bond pads 18 and 24.

In one embodiment, dielectric layer 15 includes any suitable dielectric material, such as epoxy laminates, ceramics, glass, polytetrafluorethylene, other plastics, etc. In one embodiment, soldermask 22 includes any suitable insulating material, such as, for example, acrylic-modified epoxy or epoxy. The conductive interconnects may include any conductive material, such as for example, copper, aluminum, tungsten, or molybdenum. The traces, such as traces 16 and 17, and the bond pads, such as bond pads 18 and 24, include copper, tungsten, or molybdenum. In the illustrated embodiment, a bond pad surface 20 of bond pad 18 and a bond pad surface 26 of bond pad 24 include a copper oxide. This copper oxide may be referred to as a native copper oxide which may result from ambient exposure.

FIG. 2 illustrates semiconductor structure 10 of FIG. 1 at a subsequent stage in processing in which the bond pad surfaces are prepared. Therefore, as illustrated in FIG. 6 in block 52 of method 50, the bond pad surface may be prepared by first de-greasing the bond pad surface as illustrated in block 54 and then performing a clean in order to remove the native copper oxide from the bond pad surface, as illustrated in block 56. In one embodiment, an etchant including an acid may be used to perform the clean of the bond pad surface. The etchant may be any suitable etchant, such as, for example, sulfuric acid, hydrochloric acid, peroxide with acid, etc. Therefore, referring back to FIG. 2, bond pad surface 30 and bond pad surface 32 are cleaned bond pad surfaces which do not include native copper oxide. Note that, in one embodiment, rinsing, such as with de-ionized water, is performed after de-greasing and after cleaning. Also, in alternate embodiments, additional processing steps may be used to prepare the bond pad surfaces.

FIG. 3 illustrates semiconductor structure 10 of FIG. 2 at a subsequent stage in processing in which the bond pad surfaces are treated. Therefore, as illustrated in block 58 of method 50, after the bond pad surfaces are prepared, the bond pad surfaces are treated by a solution containing HEDP or an alkyl derivative of HEDP. In one embodiment, the solution includes 1 gram of HEDP or alkyl derivative of HEDP per liter of water. In this embodiment, the pH of the solution is at about 2.5. The solution may also include additional additives such as one or more surfactants and/or roughening agents. In one embodiment, the solution may include a surfactant that is non-ionic or which may have a high molecular weight alcohol. The surfactant may include, for example, polyethylene glycol, alkylphenol ethoxylates, ethoxylated aliphatic alcohol, polyoxyehylene compounds, or carboxylic esters. In one embodiment, package substrate 12 may be submerged or dipped in the solution for an amount of time in the range of 30 seconds to 2 minutes. Alternatively, the solution may be sprayed onto the bond pad surfaces. In one embodiment, the submersion or spraying is performed with the solution being at a temperature in a range of 20 to 85 degrees Celsius. In another embodiment, the pH of the solution may be changed, such as by including a pH changing agent, and may be in a range of 2 to 9. In one embodiment, the pH changing agent may be an acid, such as citric acid or malic acid. Alternatively, the pH changing agent may be an alkaline substance, such as ammonium hydroxide or sodium hydroxide. When a bond pad surface is treated with this solution, the active sites of the copper surface of the bond pad surface may be inhibited which may thus prevent the further oxidation of the copper surface. Therefore, referring to FIG. 3, bond pad surface 34 and bond pad surface 36 are treated surfaces. In this manner, copper oxidation may be inhibited on surfaces 34 and 36.

Figure 7:
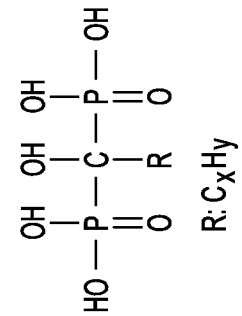
FIG. 7 illustrates, in diagrammatic form, a chemical structure in accordance with an embodiment of the present invention.

FIG. 7 illustrates the chemical structure of HEDP or an alkyl derivative of HEDP. As illustrated in FIG. 7, group R may include $C_xH_y$, in which x and y are integers greater than zero. In the case of R being $CH_3$, the structure of FIG. 7 illustrates the chemical structure of HEDP. In the case of R being a different combination of C and H, the structure of FIG. 7 illustrates the chemical structure of an alkyl derivative of HEDP. Therefore, as used herein, HEDP refers to a chemical with the structure illustrated in FIG. 7 in which the R group is $CH_3$, and an alkyl derivative of HEDP refers to a chemical with the structure illustrated in FIG. 7 in which the R group is another combination of C and H.

Figure 4:
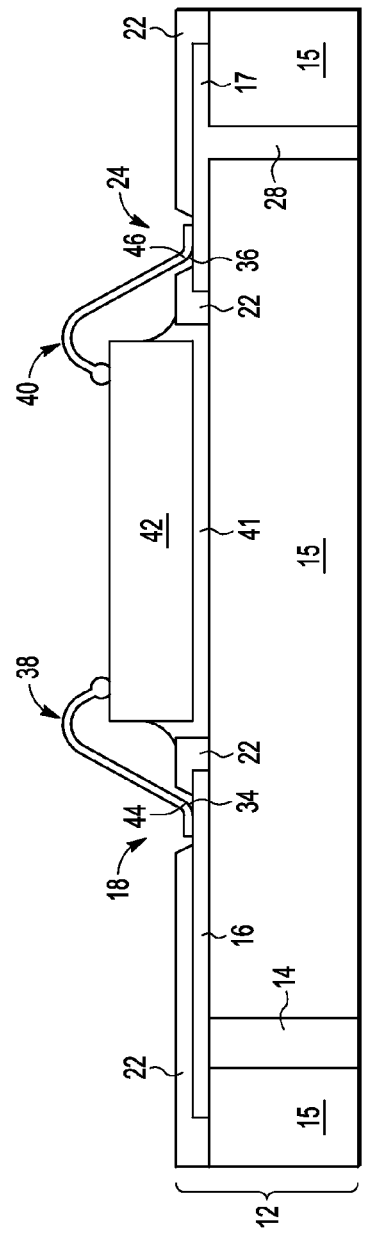

FIG. 4 illustrates semiconductor structure 10 of FIG. 3 at a subsequent stage in processing in which a semiconductor die 42 is attached to a front side of package substrate 12 (opposite the backside of substrate 12) with an adhesive 41 and wire bond connections 38 and 40 are formed. Therefore, as illustrated in FIG. 6 in block 60 of method 50, die 42 is attached to package substrate 12 (with adhesive 41), and as illustrated in block 62 of method 50, wire bond connections, such as wire bond connections 38 and 40, are formed between die 42 and treated bond pad surfaces 34 and 36. For example, referring to FIG. 4, wire bond connection 38 is bonded to a bond pad of die 42 with a ball bond and bonded to treated bond pad surface 34 of bond pad 18 with a stitch bond. Wire bond connection 40 is bonded to a bond pad of die 42 with a ball bond and bonded to treated bond pad surface 36 of bond pad 24 with a stitch bond. In another configuration, a ball bond with the wire removed (a stud bump) may be formed on the bond pads on die 42. In this configuration, a ball bond would be formed on treated bond pad surfaces 34 and 36 and a stitch bond would be formed on the stud bump previously formed on the bonds pads on die 42.

Since the bond pad surfaces have been treated so as to inhibit formation of copper oxide, a reliable bond may be formed with the bond pads of package substrate 12, such as bond pads 18 and 24. Furthermore, note that the application of the solution which contains HEDP or an alkyl derivative of HEDP does not form a layer on the bond pad whose thickness prevents formation of a reliable bond between the wire bond connection and the bond pad. In one embodiment, upon treating the bond pads with the solution which contains HEDP or an alkyl derivative of HEDP, a remnant of HEDP or an alkyl derivative of HEDP may remain on the top surface of the treated bond pads (e.g. on treated bond bad surfaces 34 and 36. In one embodiment, the thickness of this remnant is less than or equal to 2 nanometers and does not prevent the formation of reliable stitch bonds, or ball bonds, of the wire bond connections to the treated bond pad surfaces. Also, in one embodiment, formation of the remnant by the application of the solution containing HEDP or an alkyl derivative of HEDP is self-limiting, thus controlling a thickness of the remnant from becoming too thick for reliable wire bond connection formation.

Figure 5:
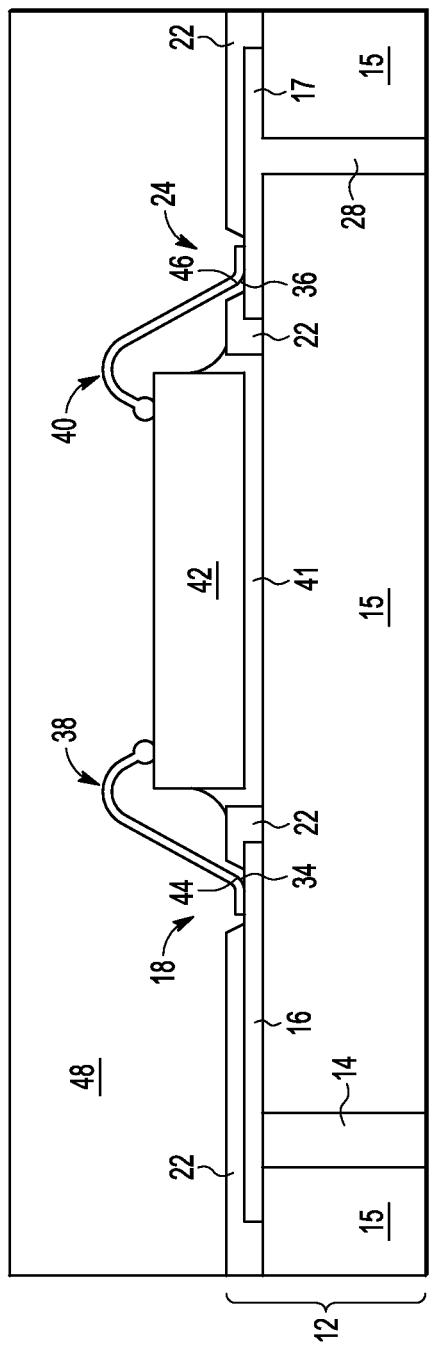
Figure 6:
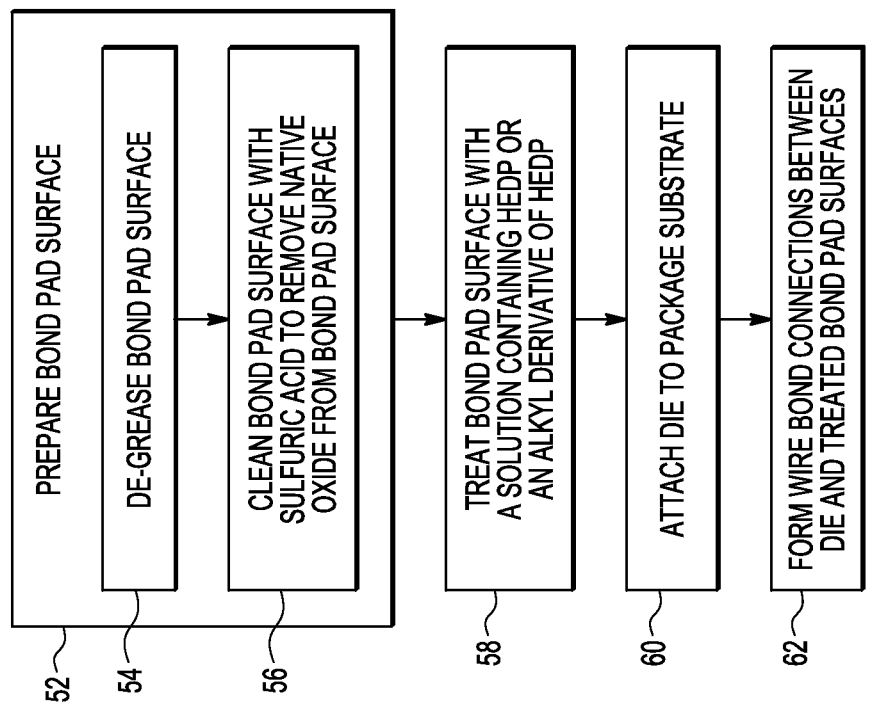
FIG. 6 illustrates, in flow diagram form, a method for treating a bond pad of a semiconductor package.

FIG. 5 illustrates semiconductor structure 10 of FIG. 4 at a subsequent stage in processing in which an encapsulant 48 is formed over package substrate 12 and encapsulates die 42 and the wire bond connections. Encapsulant 48 may be, for example, a mold compound, epoxy, etc. Additional processing may subsequently be performed, such as, for example, to form solder balls on the backside of package substrate 12 to allow for external connections, such as, for example, to a PCB or an interposer substrate.

By now it should be appreciated that there has been provided a method for treating bond pad surfaces of a package substrate using a solution which contains HEDP or an alkyl derivative of HEDP in order to allow for improved wire bond connections.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

One embodiment of the present invention provides for a method of making a packaged device having a substrate, a copper bond pad on the substrate, and a semiconductor die. The method includes preparing a top surface of the copper bond pad by removing copper oxide from the top surface; applying a solution to the top surface to result in a treated top surface of the bond pad, wherein the solution comprises one of a group consisting of HEDP and an HEDP alkyl derivative;

attaching the semiconductor die to the substrate; and attaching a wirebond connection between the treated bond pad and the semiconductor die.

In a further aspect of the above embodiment, the applying the solution comprises dipping the substrate in a bath containing the solution. In another further aspect of the above embodiment, the applying the solution includes spraying the solution on the treated top surface. In another further aspect of the above embodiment, the applying the solution is a self limiting process by which a protective layer is formed as the treated surface having a thickness that is self-limited.

In another further aspect of the above embodiment, the applying the solution is further characterized by the solution further comprising a surfactant. In yet a further aspect of the above embodiment, the applying the solution is further characterized by the surfactant being non-ionic. In another further aspect of the above embodiment, the applying the solution is further characterized by the surfactant comprising polyethylene glycol.

In another further aspect of the above embodiment, the applying the solution is further characterized by the solution further comprising a pH changing agent. In a further aspect, the applying the solution is further characterized by the pH changing agent comprising an acid or an alkaline substance.

In another further aspect of the above embodiment, the preparing the top surface includes performing a clean of the top surface; and removing the copper oxide using an etchant. In a further aspect, the removing the copper oxide using an etchant includes using an acid as the etchant. In another further aspect, the removing the copper oxide using an etchant includes using one of group consisting of citric acid and malic acid.

Another embodiment of the present invention provides for a method of making a packaged device. The method includes obtaining a substrate having a copper bond pad having a remnant of one of a group consisting of HEDP and an HEDP derivative on a top surface of the copper bond pad; attaching a semiconductor die to the substrate; and attaching a wirebond connection between the remnant and the semiconductor die.

In another further aspect of the above embodiment, the attaching the wirebond connection is further characterized by the wirebond connection including a stitch bond contacting the bond pad through the remnant. In another further aspect of the above embodiment, the obtaining the substrate is further characterized by the remnant being a monolayer.

Yet another embodiment of the present invention provides for a method of making a package substrate having a copper bond pad and a location for receiving a semiconductor die. The method includes preparing a top surface of the copper bond pad by removing copper oxide from the top surface; and applying a solution to the top surface to result in a treated top surface of the bond pad, wherein the solution comprises one of a group consisting of HEDP and an HEDP alkyl derivative.

In a further aspect of the above embodiment, the applying the solution includes dipping the substrate in a bath containing the solution. In yet a further aspect, the applying the solution comprises spraying the solution on the treated top surface.

In another further aspect of the above embodiment, the applying the solution is a self limiting process by which a protective layer is formed as the treated surface having a thickness that is self-limited.

In another further aspect of the above embodiment, the applying the solution is further characterized by the solution further including a surfactant.

What is claimed is:

1. A method of making a packaged device having a substrate, a copper bond pad on the substrate, and a semiconductor die, comprising:
    preparing a top surface of the copper bond pad by removing copper oxide from the top surface;
    applying a solution to the top surface to result in a treated top surface of the bond pad, wherein the solution comprises one of a group consisting of 1-Hydroxyethylidene-1, 1-Diphosphonic Acid (HEDP) and an HEDP alkyl derivative;
    attaching the semiconductor die to the substrate; and
    attaching a wirebond connection between the treated bond pad and the semiconductor die.

2. The method of claim 1, wherein:
    the applying the solution comprises dipping the substrate in a bath containing the solution.

3. The method of claim 1, wherein:
    the applying the solution comprises spraying the solution on the treated top surface.

4. The method of claim 1, wherein:
    the applying the solution is a self limiting process by which a protective layer is formed having a thickness that is self-limited.

5. The method of claim 1, wherein:
    the applying the solution is further characterized by the solution further comprising a surfactant.

6. The method of claim 5, wherein:
    the applying the solution is further characterized by the surfactant being non-ionic.

7. The method of claim 5, wherein:
    the applying the solution is further characterized by the surfactant comprising polyethylene glycol.

8. The method of claim 1, wherein:
    the applying the solution is further characterized by the solution further comprising a pH changing agent.

9. The method of claim 8, wherein:
    the applying the solution is further characterized by the pH changing agent comprising an acid or an alkaline substance.

10. The method of claim 1, wherein the preparing the top surface comprises:
    performing a clean of the top surface; and
    removing the copper oxide using an etchant.

11. The method of claim 10, wherein the removing the copper oxide using an etchant comprises using an acid as the etchant.

12. The method of claim 10, wherein the removing the copper oxide using an etchant comprises using one of a group consisting of citric acid and malic acid.

13. A method of making a packaged device, comprising:
    obtaining a substrate having a copper bond pad having a remnant of one of a group consisting of 1-Hydroxyethylidene-1, 1-Diphosphonic Acid (HEDP) and an HEDP derivative on a top surface of the copper bond pad;
    attaching a semiconductor die to the substrate; and
    attaching a wirebond connection between the remnant and the semiconductor die.

14. The method of claim 13, wherein the attaching the wirebond connection is further characterized by the wirebond connection comprising a stitch bond contacting the bond pad through the remnant.

15. The method of claim 13, wherein the obtaining the substrate is further characterized by the remnant being a monolayer.

16. A method of making a package substrate having a copper bond pad and a location for receiving a semiconductor die, comprising:

preparing a top surface of the copper bond pad by removing copper oxide from the top surface; and applying a solution to the top surface to result in a treated top surface of the bond pad, wherein the solution comprises one of a group consisting of 1-Hydroxyethylidene-1, 1-Diphosphonic Acid (HEDP) and an HEDP alkyl derivative.

17. The method of claim 16, wherein:

the applying the solution comprises dipping the substrate in a bath containing the solution.

18. The method of claim 16, wherein:

the applying the solution comprises spraying the solution on the treated top surface.

19. The method of claim 16, wherein:

the applying the solution is a self limiting process by which a protective layer is formed having a thickness that is self-limited.

20. The method of claim 16, wherein:

the applying the solution is further characterized by the solution further comprising a surfactant.

* * * * *